(12) United States Patent
Graef (10) Patent No.: US 7,707,449 B2
(45) Date of Patent: Apr. 27, 2010

(54) SYSTEMS AND METHODS FOR LOW POWER MULTI-RATE DATA PATHS

(75) Inventor: Nils Graef, Sellersville, PA (US)

(73) Assignee: Agere Systems Inc., Allentown, PA (US)

( * ) Notice: Subject to any disclaimer, the term of this patent is extended or adjusted under 35 U.S.C. 154(b) by 997 days.

(21) Appl. No.: 11/394,028

(22) Filed: Mar. 29, 2006

(65) Prior Publication Data

US 2007/0237171 A1 Oct. 11, 2007

(51) Int. Cl.
*G06F 1/00* (2006.01)
*H04J 12/66* (2006.01)
*G01R 31/28* (2006.01)

(52) U.S. Cl. .................. 713/500; 370/463; 714/724

(58) Field of Classification Search .......... 370/463, 370/431; 326/41, 40, 39, 37; 713/500; 714/700, 714/724
See application file for complete search history.

(56) References Cited

U.S. PATENT DOCUMENTS

| | | | | |
|---|---|---|---|---|
| 4,833,655 | A * | 5/1989 | Wolf et al. ................ | 365/221 |
| 6,380,785 | B2 * | 4/2002 | Fisher ....................... | 327/269 |
| 6,457,161 | B1 * | 9/2002 | Nadeau-Dostie et al. ...... | 716/6 |
| 6,477,675 | B2 * | 11/2002 | Manning ................... | 714/738 |
| 6,998,872 | B1 * | 2/2006 | Chirania et al. ............. | 326/40 |
| 7,152,195 | B2 * | 12/2006 | Terazawa .................. | 714/726 |
| 2003/0088818 | A1 * | 5/2003 | Manning ................... | 714/724 |
| 2004/0088659 | A1 * | 5/2004 | Mori ........................ | 716/2 |
| 2005/0127944 | A1 * | 6/2005 | Lewis et al. ................ | 326/41 |
| 2006/0041802 | A1 * | 2/2006 | Grise et al. ................ | 714/724 |
| 2006/0224909 | A1 * | 10/2006 | Do ............................ | 713/323 |

OTHER PUBLICATIONS

Neil H.E. Weste and David Harris, CMOS VLSI Design, A Circuits and Systems Perspective; 2005; pp. 20-23; and pp. 383-387; 3$^{rd}$ Edition; Pearson Education, Inc.
Jan M. Rabaey, Anantha Chandrakasan and Borivoje Nikolic; Digital Integrated Circuits, A Design Perspective; 2003; pp. 495-519; 2$^{nd}$ Edition; Pearson Education, Inc.
Jan M. Rabaey, Anantha Chandrakasan, and Borivoje Nikolic; Digital Integrated Circuits, A Design Perspective, Designing Sequential Logic Circuits, Nov. 2002 Symposium.

* cited by examiner

*Primary Examiner*—Kwang B Yao
*Assistant Examiner*—Candal Elpenord
(74) *Attorney, Agent, or Firm*—Hamilton, DeSanctis & Cha (57) ABSTRACT

Various systems and methods for low power multi-rate data paths are disclosed. As one example, a semiconductor device that includes a multi-rate data path is discussed. The multi-rate data path includes at least two register circuits with an output of one of the register circuits electrically coupled to an input of the other register circuit via a combinational logic block. In addition, the semiconductor device includes a control circuit that is operable to modify the rate at which the multi-rate data path operates by selectably bypassing at least one of the register circuits.

20 Claims, 8 Drawing Sheets

SYSTEMS AND METHODS FOR LOW POWER MULTI-RATE DATA PATHS

BACKGROUND OF THE INVENTION

The present invention is related to systems and methods for power reduction in a semiconductor device.

Figure 1A:
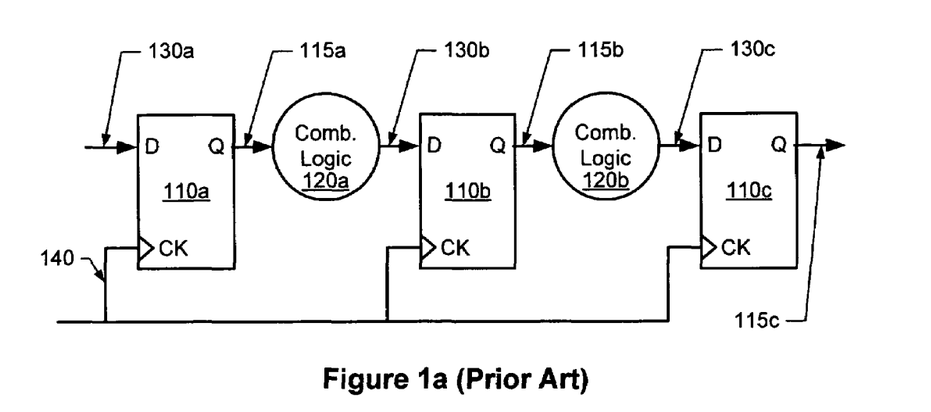
FIGS. 1a-1b depict a data path and associated timing diagram as is known in the art.
Figure 1B:
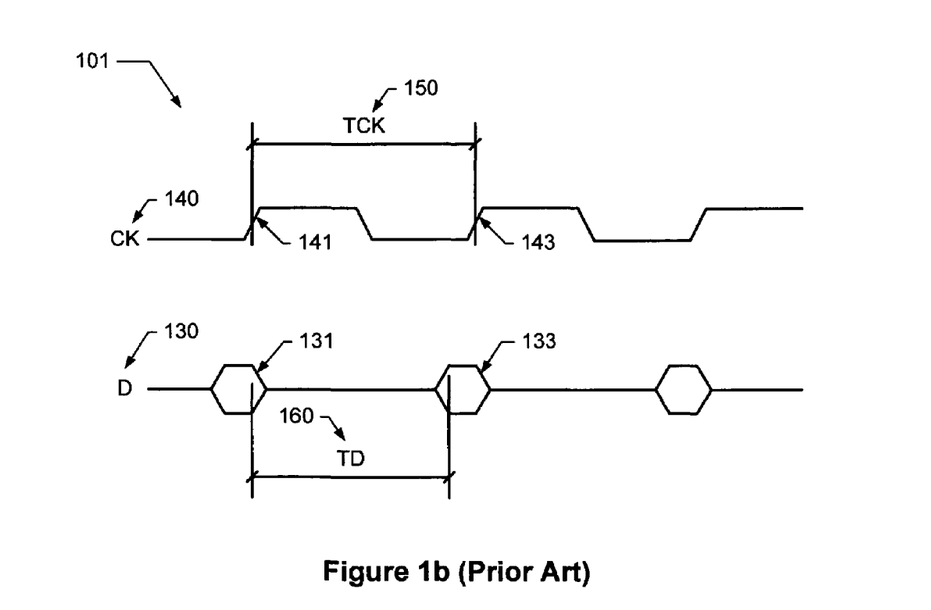

Semiconductor designs often include a number of pipelined data paths that are exemplified in FIGS. 1a-1b. In particular, a pipelined data path 100 is shown in FIG. 1a, and a timing diagram 101 depicting operation of data path 100 is shown in FIG. 1b. As shown, pipelined data path 100 includes a number of D flip-flops 110 each separated by a combinational logic block 120. Each of D flip-flops 110 is fed by a D input 130 and a clock input 140, and each includes an output 115. In operation, output 115 is changed to reflect input 130 of the respective D flip-flop each time a rising edge of clock input 140 is received.

To operate properly, a preceding output must stabilize and propagate through the intervening combinational logic before the subsequent rising edge of the clock is received at the input of the subsequent flip-flop. As a particular example, output 115a of flip-flop 110a must switch to reflect input 130a (depicted as a value 131) on a rising edge 141 of clock input 140, and output 115a must propagate through combinational logic 120a and stabilize as input 130b (depicted as a value 133) before a subsequent rising edge 143 of clock input 140. Thus, for the design to operate properly, a period 150 of clock input 140 must be greater than a delay time 160 that includes the time to switch the preceding flip-flop, and to propagate through the intervening combinational logic.

Further, where it is desirable to minimize gate count and power dissipation, delay time 160 is designed to be very close to period 150. This approach can be used to minimize the number of pipeline stages, and thus the number of flip-flops used in a particular design. However, such an approach limits operational efficiencies that may be achieved in multi-rate systems. Thus, for at least the aforementioned reasons, there exists a need in the art for advanced systems and methods for power reductions in semiconductor devices.

BRIEF SUMMARY OF THE INVENTION

The present invention is related to systems and methods for power reduction in a semiconductor device.

Various systems and methods for low power multi-rate data paths are disclosed. As one example, a semiconductor device that includes a multi-rate data path is discussed. The multi-rate data path includes at least two register circuits with an output of one of the register circuits electrically coupled to an input of the other register circuit via a combinational logic block. In addition, the semiconductor device includes a control circuit that is operable to modify the rate at which the multi-rate data path operates by selectably bypassing at least one of the register circuits.

Some embodiments of the present invention provide a semiconductor device that includes a multi-rate data path and a control circuit. The multi-rate data path includes at least two register circuits each of which may be selectably controlled by a control circuit. In particular, the data path includes a first register circuit and a second register circuit with the output of the first register circuit electrically coupled to an input of the second register circuit via a combinational logic block. In operation, the control circuit may be operated to selectably bypass the second register circuit. The multi-rate data path may exhibit two or more rates of operation that are selectable by bypassing one or more of the first and second register circuits. The register circuits may include, but are not limited to, latches and flip-flops.

In one particular instance of the aforementioned embodiments, the second register circuit includes a flip-flop and a multiplexer. The input of the flip-flop is electrically coupled to one input of the multiplexer, the output of the flip-flop is electrically coupled to another input of the multiplexer, and the control circuit is electrically coupled to a selector input of the multiplexer. Bypassing the second register circuit is done by asserting the selector of the multiplexer such that the input of the flip-flop is selected. Such a selection is done where a lower rate of operation is desired. In some cases, the control circuit is further operable to power down the flip-flop when the flip-flop has been bypassed.

In other instances of the aforementioned embodiments, the second register circuit includes a latch with a data input, a clock input and an output. In such instances, the second register circuit may be bypassed by controlling the clock input. In particular, the clock input may be maintained in an assertion state that causes a value presented at the data input to be passed directly to the output. This is done whenever a lower rate of operation is desired. Alternatively, where a higher rate of operation is desired, the clock input is toggled such that values presented at the data input are clocked to the output. In some cases, the control circuit is further operable to power down a portion of the latch when the latch has been bypassed.

Other embodiments of the present invention provide methods for variable rate data path operation. Such methods include providing a data path that exhibits two or more rates of operation. The data path includes a first register circuit with an input of the first register circuit being electrically coupled to a combinational logic block, and a second register circuit. An input of the second register circuit is electrically coupled to an output of the first register circuit via another combinational logic block. The method further includes, selecting a lower rate of operation for the multi-rate data path by bypassing the first register circuit.

In some instances of the aforementioned embodiments, the first register circuit includes a flip-flop and a multiplexer. The input to the flip-flop is electrically coupled to a first input of the multiplexer and the output of the flip-flop is electrically coupled to a second input of the multiplexer. In such instances, selecting the lower rate of operation includes asserting a selector input of the multiplexer such that the first input of the multiplexer is selected, and powering down the flip-flop.

In other instances of the aforementioned embodiments, the first register circuit includes a latch with a data input, a clock input and an output. In such instances, selecting the lower rate of operation includes maintaining the clock input of the latch of the first register circuit asserted during the lower rate of operation. By doing so, a value presented at the data input is passed directly to the output. In some cases, a portion of the latch may be powered down during the lower rate of operation.

Yet other embodiments of the present invention provide a semiconductor device with a data path comprising four or more register circuits. In particular, an input of a first register circuit is electrically coupled to a first combinational logic block, and an output of the first register circuit is electrically coupled to an input of a second register circuit via a second combinational logic block. An output of the second register circuit is electrically coupled to an input of a third register circuit via a third combinational logic block, and an output of the third register circuit is electrically coupled to an input of a fourth register circuit via a fourth combinational logic block. In addition, the semiconductor device includes a control circuit that is operable to modify a rate at which the multi-rate data path operates by selectably bypassing one or more of the first register circuit, the second register circuit, and the third register circuit. In some cases, the first register circuit, the second register circuit and the third register circuit includes a register device selected from a group consisting of: a latch and a multiplexer bypassed flip-flop. Thus, it may be that each of the three register circuits are formed exclusively of either latches or flip-flops, or of a combination of latches and flip-flops.

In some instances of the aforementioned embodiments, the multiplexer bypassed flip-flop includes a flip-flop and a multiplexer. The input to the flip-flop is electrically coupled to one input of the multiplexer and the output of the flip-flop is electrically coupled to another input of the multiplexer, and a selector of the multiplexer is electrically coupled to the control circuit. In some instances of the aforementioned embodiments, the latch includes a data input, a clock input and an output; and the clock input is at least in part controlled by the control circuit.

In various instances of the aforementioned embodiments, the data path exhibits at least a first rate of operation and a second rate of operation. The first rate of operation is greater than the second rate of operation. In the second rate of operation, the first register circuit and the third register circuit are selectably bypassed. In various other instances of the aforementioned embodiments, the data path further exhibits at least a third rate of operation that is less than the second rate of operation. In the third rate of operation, the first register circuit, the second register circuit, and the third register circuit are selectably bypassed.

Yet other embodiments of the present invention provide design tools for implementing low power, multi-rate data paths. The design tool includes a post-processing engine that is operable to select a data path that is composed of a series of register circuits. The post processing engine is further operable to receive a command designating the data path to have two or more rates of operation, and to implement a bypass of one or more of the register circuits. As such, the one or more register circuits are bypassed (i.e., rendered inoperable or transparent) when one rate of operation is selected, and not bypassed (i.e., rendered operable or non-transparent) when another rate of operation is selected.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for power reduction in a semiconductor device.

Various systems and methods for low power multi-rate data paths are disclosed. In some embodiments, such multi-rate data paths include a series of register circuits operating as stages of a data path. In the series of register circuits, an output of a preceding register circuit is electrically coupled to a combinational logic block, and the output of the combinational logic block drives an input of a succeeding register circuit. The systems further include a control circuit that is operable to modify the rate at which the multi-rate data path operates by selectably bypassing at least one of the register circuits. In some instances, when a register circuit is selectably bypassed, at least a portion of the bypassed register circuit is powered down.

In some cases, the multi-rate data paths may be selectably operated at two rates of operation—a high rate operation and a low rate operation. In particular instances of the preceding cases, the low rate of operation is approximately half of the high rate of operation. In other cases, the multi-rate data paths may be selectably operated at three rates of operation—a high rate operation, a medium rate operation, and a low rate operation. In particular instances of the preceding cases, the low rate of operation is approximately half of the medium rate of operation, and the medium rate of operation is approximately half of the high rate of operation. Based on the disclosure provided herein, one of ordinary skill in the art will recognize that systems may be designed with four or more rates of operation and/or that other ratios may be exhibited between high, medium and low rates of operation in accordance with yet other embodiments of the present invention.

Particular embodiments of the present invention may include a multi-rate data path incorporated in a read channel that operates between, for example, 300 MHz and 1.8 GHz. Other embodiments of the present invention may include a multi-rate data path incorporated in a microprocessor capable of operation at different data rates, while yet other embodiments of the present invention may include a multi-rate data path incorporated into a DVD-ROM that is operable at, for example, 1×, 2× and 4× rates. Based on the disclosure provided herein, one of ordinary skill in the art will recognize a variety of other applications into which multi-rate data paths in accordance with embodiments of the present invention may be incorporated.

As used herein, the phrase "register circuit" is used in its broadest sense to mean any circuit or device that is capable of receiving a data input and maintaining the value of the data input for a prescribed period. Thus, a register circuit may include, but is not limited to, a circuit with a static latch, a static flip-flop, a pseudo static latch, a pseudo static flip-flop, a dynamic latch, or a dynamic flip-flop. Based on the disclosure provided herein, one of ordinary skill in the art will recognize other circuits or devices that may be incorporated as part of a register circuit in accordance with different embodiments of the present invention. Also, as used herein, the phrase "combinational logic block" is used in its broadest sense to mean any logic circuitry that receives one or more input signals and provides one or more output signals based on the input signals. Thus, for example, a combinational logic block may include, but is not limited to, one or more of an AND gate, a NAND gate, an OR gate, a NOR gate, an INVERTER, and/or a direct connection such as a wire. Based on the disclosure provided herein, one of ordinary skill in the art will recognize a variety of elements that may be incorporated in a combinational logic block in accordance with one or more embodiments of the present invention. Yet further, as used herein, the phrase "electrically coupled" is used in its broadest sense to mean any form of coupling whereby an electrical signal may be transferred from one device to another. Thus, an electrical coupling may be, but is not limited to, coupling via a conductive wire, coupling via a resistor, coupling via a capacitor, coupling via an inductor, coupling via a transistor, any combination of the aforementioned, and/or the like.

Figure 2:
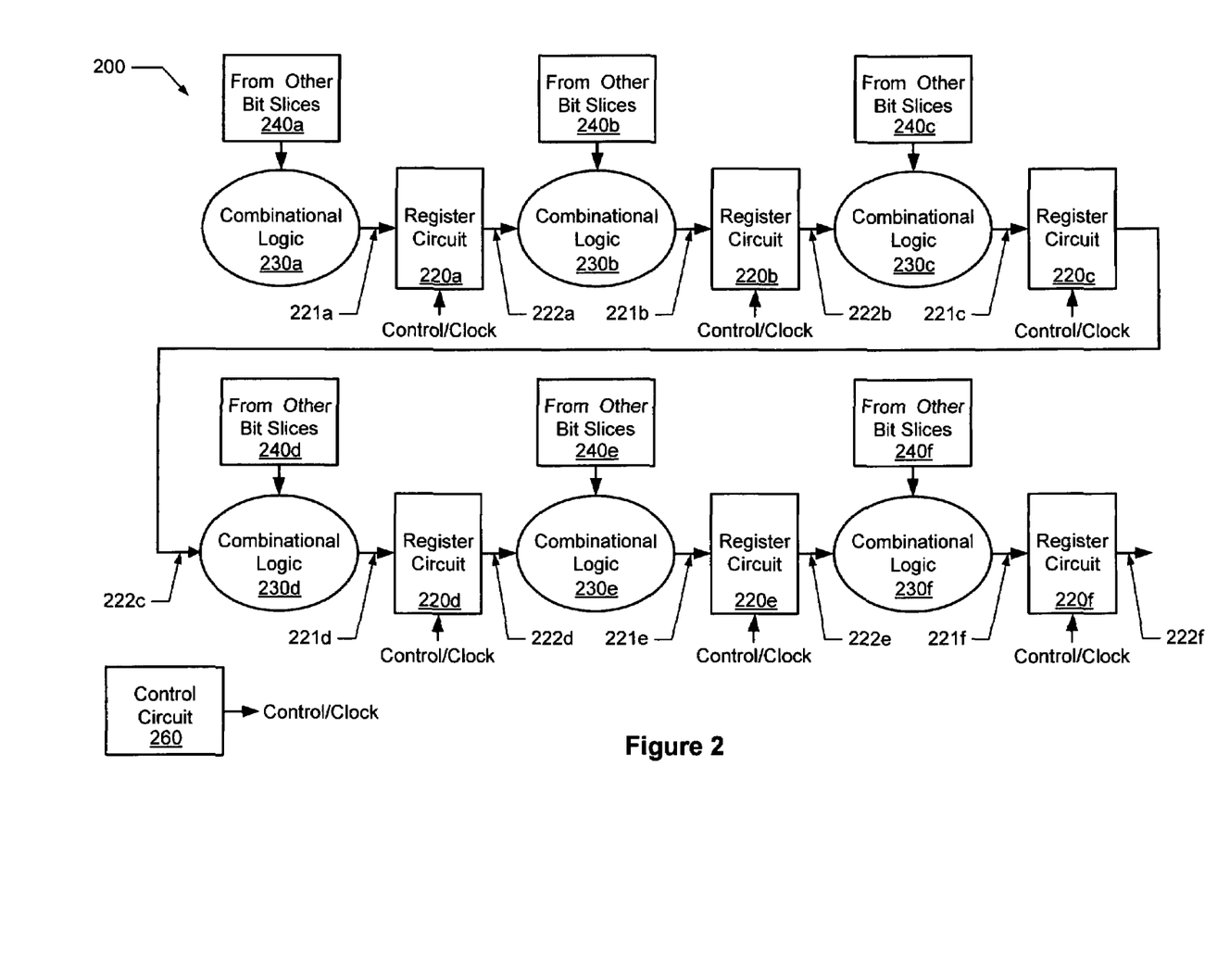
FIG. 2 depicts a multi-rate data path and control circuit in accordance with various embodiments of the present invention.

Turning to FIG. 2, a multi-rate data path 200 and control circuit 260 in accordance with various embodiments of the present invention is depicted. Multi-rate data path 200 includes a series of register circuits 220 with intervening combinational logic blocks 230. An input 221a of register circuit 220a is driven by a combinational logic block 230a. Combinational logic block 230a receives inputs from other parts of the circuit in which data path 200 is disposed. These other parts of the circuit are generically referred to as other bit slices 240a and can be any input received from a latch, flip-flop, combinational logic, I/O and/or other part of the overall circuit. An output 222a of register circuit 220a is provided as an input to combinational logic block 230b. In addition, combinational logic block 230b receives an input from other bit slices 240b. Based on the inputs, combinational logic block 230b provides an input 221b to register circuit 220b. Thus, register circuit 220a is electrically coupled to register circuit 220b.

Similarly, register circuit 220b is electrically coupled to register circuit 220c via combinational logic block 230c. Register circuit 220c is electrically coupled to register circuit 220d via combinational logic block 230d. Register circuit 220d is electrically coupled to register circuit 220e via combinational logic block 230e. Register circuit 220e is electrically coupled to register circuit 220f via combinational logic block 230f.

Control circuit 260 provides control/clock signals to one or more of register circuits 220 depending upon the desired flexibility of multi-rate data path 200. In operation, the control/clock signals provided by control circuit 260 are provided to select register circuits 220 such that the select register circuits are bypassed. For example, where a high rate of operation and a low rate of operation are to be provided by data path 200, the control/clock signals may be provided to every other register circuit 220 such that every other register circuit 220 may be bypassed and/or disabled. In particular, just a clock signal may be provided to each of register circuit 220b, register circuit 220d and register circuit 220f. In contrast, where multiplexed flip-flops are used to implement register circuits 220, a control and a clock signal may be provided to each of register circuit 220a, register circuit 220c and register circuit 220e. As such, register circuits 220b, 220d, 220f are always operational, while register circuits 220a, 220c, 220e are selectably operational.

For the high rate of operation, all of register circuits 220 are operated. At each clock cycle, data from inputs 221 is latched into the associated register circuit. In such a case, the period of the clock may be relatively short as signals only need to propagate through a single layer of combinational logic 230 between register stages.

In contrast, for the low rate of operation, only register circuits 220b, 220d, 220f are operated, and register circuits 220a, 220c, 220e are bypassed. When the register circuits are bypassed, they are transparent allowing data to pass through the particular register circuit without being clocked. It should be noted that in some cases a bypassed register circuit adds a propagation delay similar to a logic gate. In such a case, the period of the clock is increased as the signals now need to propagate from one operational register circuit to a subsequent operational register circuit. Thus, for example, the required period of the clock is increased to allow output 222b to propagate through combinational logic 230c, through bypassed register circuit 220c, and through combinational logic 230d before being clocked into register circuit 220d. In such a case, the period of the clock for the low rate of operation is approximately twice the period of the clock for the high rate of operation.

Multi-rate data path 200 may also be configured to provide three rates of operation—a high rate, a low rate and a medium rate. Similar to that described above, for the high rate of operation, all of register circuits 220 are operated. At each clock cycle, data from inputs 221 is latched into the associated register circuit. In such a case, the period of the clock may be relatively short as signals only need to propagate through a single layer of combinational logic 230 between register stages. Similar to the low rate of operation described earlier, for the medium rate of operation, only register circuits 220b, 220d, 220f are operated, and register circuits 220a, 220c, 220e are bypassed. In such a case, the required period of the clock is increased as the signals now need to propagate from one operational register circuit to a subsequent operational register circuit. Thus, for example, the period of the clock is increased to allow output 222b to propagate through combinational logic 230c, through bypassed register circuit 220c, and through combinational logic 230d before being clocked into register circuit 220d. In such a case, the period of the clock for the low rate of operation is approximately twice the period of the clock for the high rate of operation.

In contrast, for the low rate of operation, only register circuits 220b, 220f are operated, and register circuits 220a, 220c, 220d, 220e are bypassed. In such a case, the period of the clock is further increased as the signals now need to propagate from one operational register circuit to a subsequent operational register circuit. Thus, for example, the required period of the clock is further increased to allow output 222b to propagate through combinational logic 230c, through bypassed register circuit 220c, through combinational logic 230d, through bypassed register circuit 220e, and through combinational logic 230f before being clocked into register circuit 220f. In such a case, the period of the clock for the low rate of operation is approximately twice the period of the clock for the medium rate of operation, and approximately four times the period of the clock for the high rate of operation.

Based on the disclosure provided herein, one of ordinary skill in the art will recognize that multi-rate data path 200 may be any length from two register circuits to potentially tens of thousands of register circuits. Further, based on the disclosure provided herein, one of ordinary skill in the art will recognize that four or more data rates may be offered by a multi-rate data path in accordance with embodiments of the present invention. Multi-rate data paths offering increased numbers of rates of operation can be formed using additional control signals from control circuit 260 to allow for the bypassing of more register circuits.

Multi-rate data paths may be formed consistent with a number of different technologies including, but not limited to, two-phase data paths formed of latches, single phase data paths formed of flip-flops, or single phase data paths formed of pulsed flip-flops. The discussion provided below in relation to FIG. 3 focuses on a two-phase data path formed of latches, while that of FIG. 4 focuses on a data path formed using flip-flops. Based on the disclosure provided herein, one of ordinary skill in the art will recognize other design styles, logic families and/or technologies may be used in relation to various embodiments in accordance with the present invention.

Figure 3A:
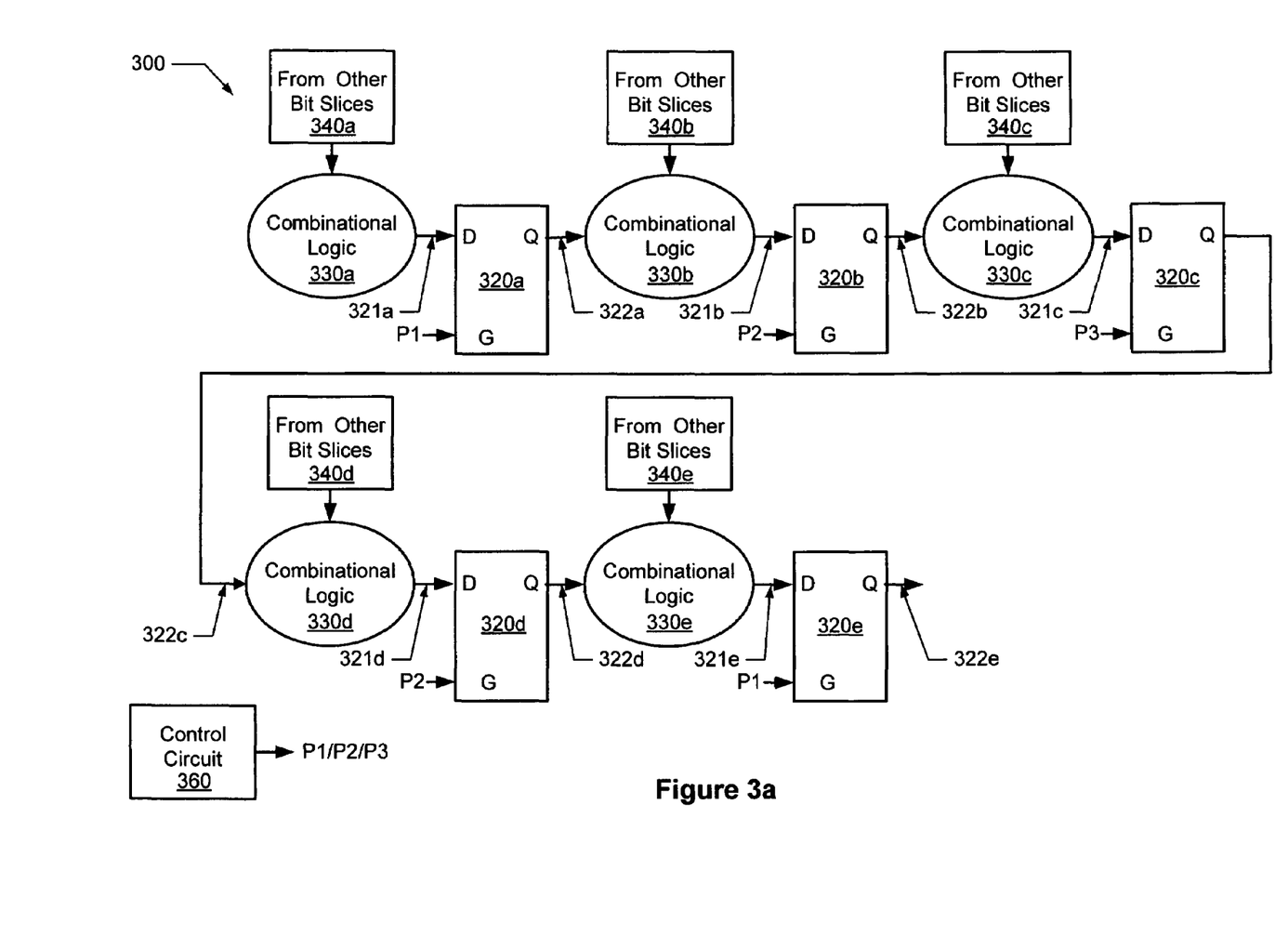
FIGS. 3a-3d depict a three rate data path based on latches and a control circuit in accordance with some embodiments of the present invention.

Turning to FIG. 3a, a three rate data path 300 (high, medium and low) based on latches and a control circuit 360 in accordance with some embodiments of the present invention is depicted. Three rate data path 300 includes a series of latches 320 with intervening combinational logic blocks 330. An input 321a of latch 320a is driven by a combinational logic block 330a. Combinational logic block 330a receives inputs from other parts of the circuit in which three rate data path 300 is disposed. These other parts of the circuit are generically referred to as other bit slices 340a and can be any input received from a latch, flip-flop, combinational logic, I/O and/or other part of the overall circuit. An output 322a of latch 320a is provided as an input to combinational logic block 330b. In addition, combinational logic block 330b receives an input from other bit slices 340b. Based on the inputs, combinational logic block 330b provides an input 321b to latch 320b. Thus, latch 320a is electrically coupled to latch 320b.

Similarly, latch 320b is electrically coupled to latch 320c via combinational logic block 330c. Latch 320c is electrically coupled to latch 320d via combinational logic block 330d. Latch 320d is electrically coupled to latch 320e via combinational logic block 330e.

Figure 3B:
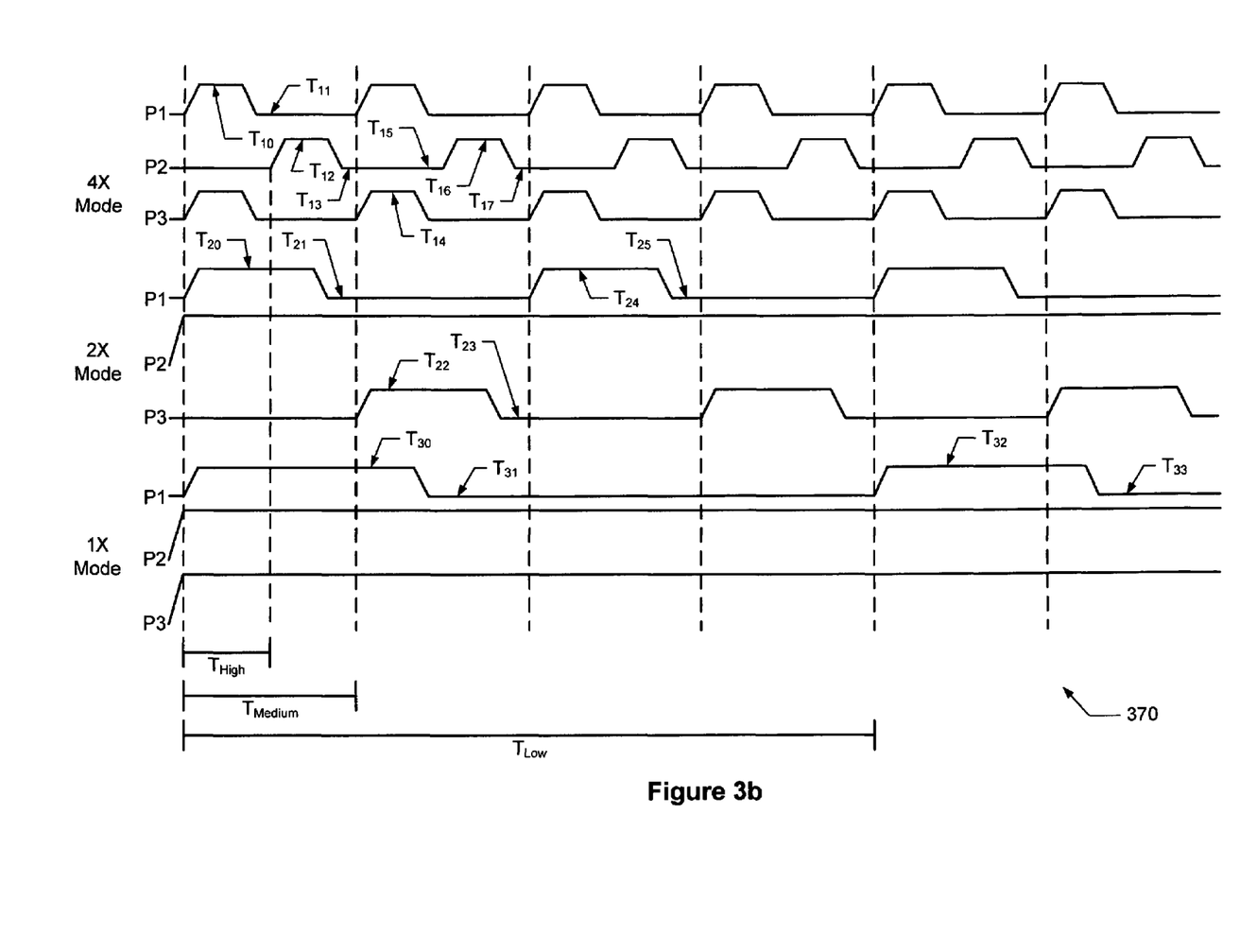

Control circuit 360 provides clock signals (P1, P2, P3) to one or more of latches 320. Turning to FIG. 3b, operation of three rate data path 300 is described in relation to a timing diagram 370. In particular, operation when the high rate is selected is designated as 4× mode on timing diagram 370, the medium rate of operation is designated as 2× mode on timing diagram 370, and the low rate of operation is designated as 1× mode on timing diagram 370. For timing diagram 370, it is assumed that latches 320 are transparent in the G input is asserted high.

When the high rate of operation is selected, all three clock signals P1, P2, P3 are applied to the respective gate inputs of latches 320. As shown, latches associated with P1 and P3 (i.e., latch 320a, latch 320c and latch 320e) are transparent during times that latches associated with P2 (i.e., latch 320b and latch 320d) are not transparent. In some cases, P1 and P3 are identical, while in other cases they are somewhat out of phase. P2 does not overlap either P1 or P3. In operation, the value from combinational logic 330a at input 321a is transferred to output 322a whenever P1 is asserted high (T10), and is latched whenever P1 is asserted low (T11). The latched data at output 322a propagates through combinational logic 330b to input 321b. When P2 is asserted high (T14), the data at input 321b is transferred to output 322b, and is latched whenever P2 is asserted low (T13). The latched data at output 322b then propagates through combinational logic 330c to input 321c. When P3 is asserted high (T14), the data at input 321c is transferred to output 322c, and is latched whenever P3 is asserted low (T15). The latched data at output 322c then propagates through combinational logic 330d to input 321d. When P2 is asserted high (T16), the data at input 321d is transferred to output 322d, and is latched whenever P2 is asserted low (T17).

Based on the description above, it can be appreciated that during the high rate of operation data is moved along three rate data path 300 on each clock (P1, P2, P3). Further, the period between each clock (designated as Thigh on timing diagram 370) is only required to be long enough to allow for a signal to propagate through a preceding latch 320 and an intervening combinational logic block 330.

In contrast, when the medium rate of operation is selected, only clock signals P1 and P3 are active, and clock signal P2 is asserted high such that latches associated with clock P2 are transparent. Thus, as shown, latch 320b and latch 320d are rendered permanently transparent, while the other latches are only transparent when P1 and P3 respectively are asserted high. In this case, P1 and P3 are not identical and in most cases would not overlap. In operation, the value from combinational logic 330a at input 321a is transferred to output 322a whenever P1 is asserted high (T20), and is latched whenever P1 is asserted low (T21). The latched data at output 322a propagates through combinational logic 330b, latch 320b, and combinational logic 330c to input 321c. When P3 is asserted high (T22), the data at input 321c is transferred to output 322c, and is latched whenever P3 is asserted low (T23). The latched data at output 322c then propagates through combinational logic 330d, latch 320d, and combinational logic 330e to input 321e. When P1 is again asserted high (T24), the data at input 321e is transferred to output 322e, and is latched whenever P1 is again asserted low (T25).

Based on the description above, it can be appreciated that during the medium rate of operation data is moved along three rate data path 300 only on clocks P1 and P3. Further, the period between each clock (designated as Tmedium on timing diagram 370) is required to be long enough to allow for a signal to propagate through two latches 320, and two intervening combinational logic blocks 330.

As a further contrast, when the low rate of operation is selected, only clock signal P1 is active, and clock signals P2 and P3 are asserted high such that latches associated with clock P2 are transparent. Thus, as shown, latch 320b, latch 320c and latch 320d are rendered permanently transparent, while the other latches are only transparent when P1 is asserted high. In operation, the value from combinational logic 330a at input 321a is transferred to output 322a whenever P1 is asserted high (T30), and is latched whenever P1 is asserted low (T31). The latched data at output 322a propagates through combinational logic 330b, latch 320b, combinational logic 330c, latch 320c, combinational logic 330d and combinational logic 330e to input 321e. When P1 is again asserted high (T32), the data at input 321e is transferred to output 322e, and is latched whenever P1 is again asserted low (T33).

Based on the description above, it can be appreciated that during the low rate of operation data is moved along three rate data path 300 only on clock P1. Further, the period between each clock (designated as Tlow on timing diagram 370) is required to be long enough to allow for a signal to propagate through three latches 320, and three intervening combinational logic blocks 330.

Figure 3C:
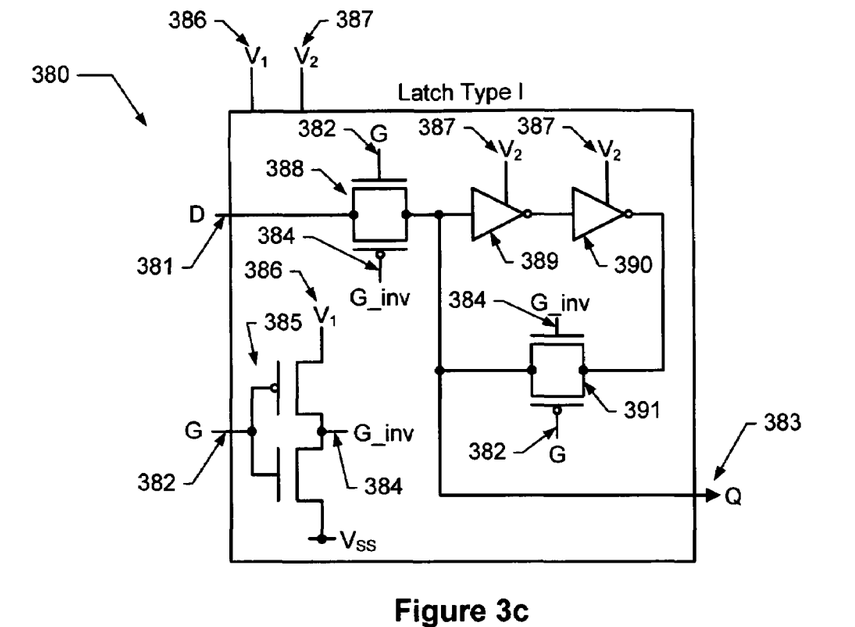

In addition to rendering one or more of latches 320 permanently transparent during different operational modes of three rate data path 300, some embodiments of the present invention utilize control circuit 360 to power down (i.e., remove power from) portions of the latches that have been rendered permanently transparent. FIG. 3c shows an exemplary transmission-gate based latch 380 that may be used in relation to three rate data path 300 where control circuit 360 includes circuitry to control the application of power to a portion of the latch.

Latch 380 includes a data input 381 (D), a gate 382 (G), and an output 383 (Q), and is transparent when the input (G) is asserted high. Gate 382 is inverted 384 using an inverter 385 that is powered by a voltage 386 (V1). Output 383 is connected directly to a transmission gate 388. Output Transmission gate 388 also drives two inverters 389, 390 that are each powered by a voltage 387 (V2). The inverters drive a transmission gate 391 that is coupled to output 383. During operations where latch 380 is not permanently transparent, both voltages 386, 387 are applied to latch 380. In contrast, during operations where latch 380 is permanently transparent, only transmission gate 388 is needed, and thus only voltage 386 is applied to latch 380 and voltage 387 is not applied. Doing so saves both dynamic power (i.e., switching) and static power (i.e., leakage). In order to avoid sub-threshold leakage current through the inverter's PMOS, voltage 386 is tied to VSS.

Figure 3D:
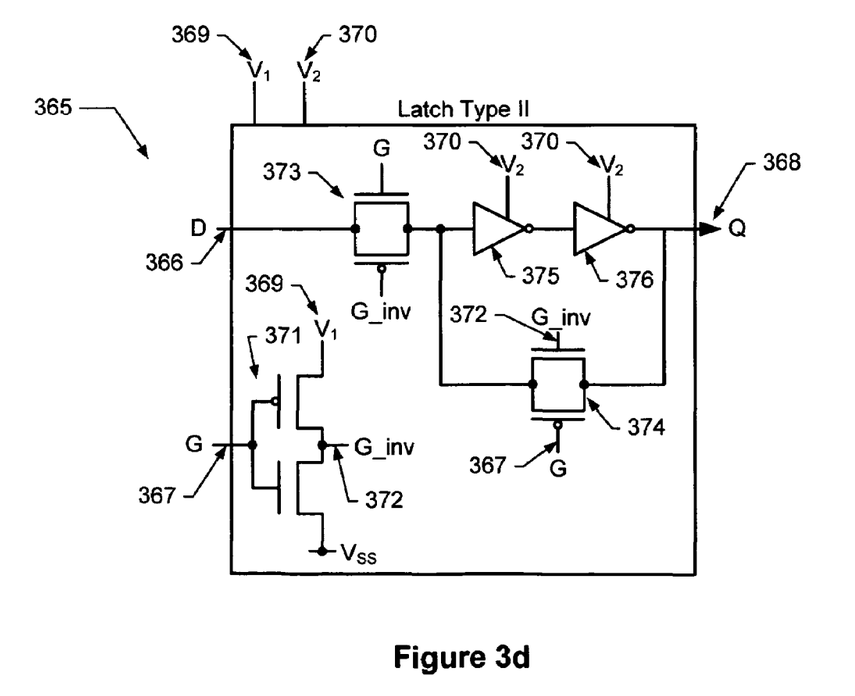

FIG. 3d shows another exemplary latch 365 with a data input 366 (D), a gate 367 (G), and an output 368 (Q) that may be used in relation to other embodiments of the present invention. Gate 367 is inverted 372 using an inverter 371 that is powered by a voltage 369 (V1). Output 368 is electrically coupled to a transmission gate 373 via two inverters 375, 376. Another transmission gate 374 is also electrically coupled between output 368 and transmission gate 373. Unlike latch 380 described above, both voltages 369, 370 are applied during operation of latch 365. However, in some cases, to voltage 369 is connected to VDD during high throughput modes (i.e., modes in which latch 365 is not rendered permanently transparent), and to VSS during low throughput modes (i.e., modes in which latch 365 is rendered permanently transparent). This avoids leakage through the inverter's PMOS.

Figure 4A:
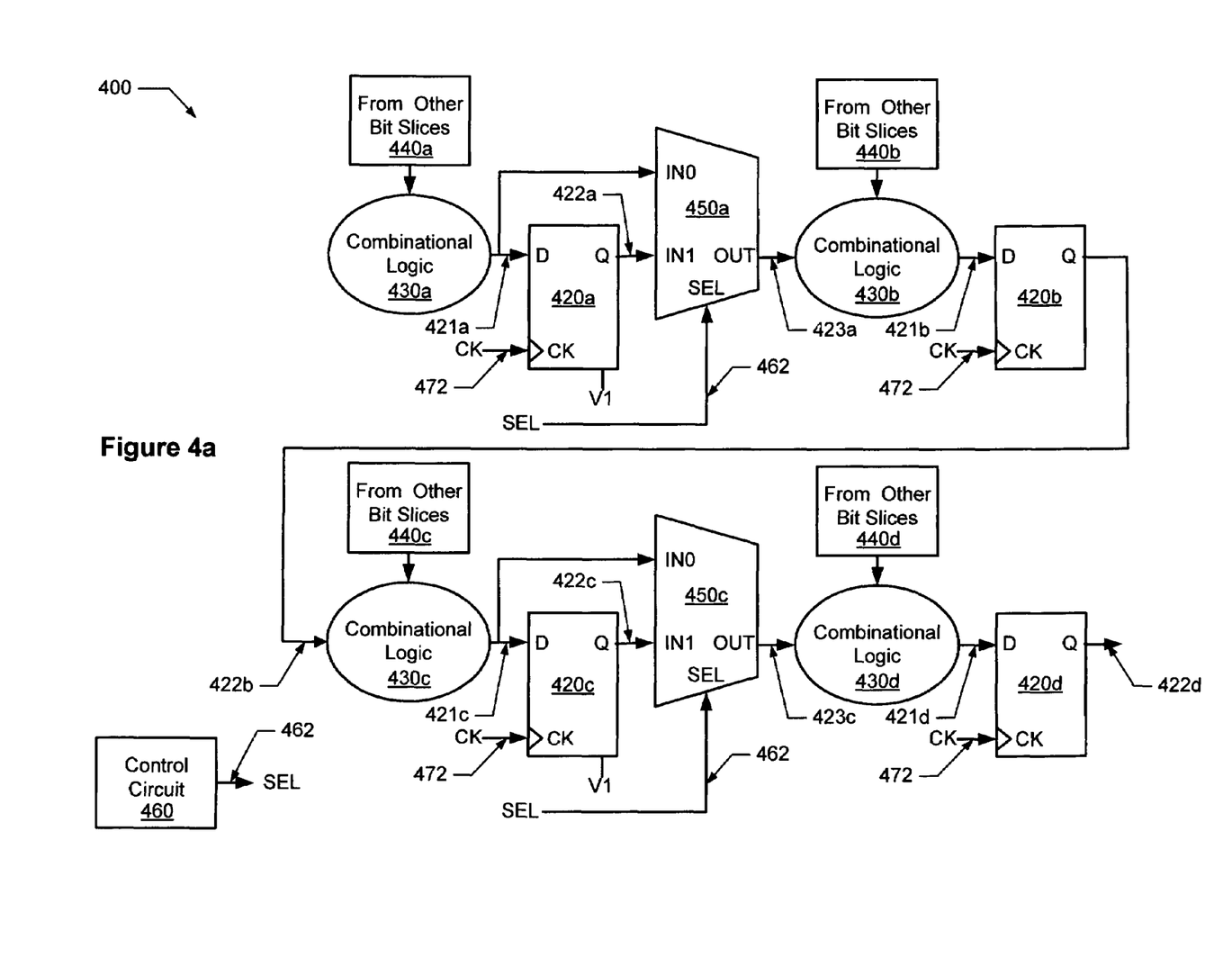
FIGS. 4a-4b depict a two rate data path based on flip-flops and a control circuit in accordance with other embodiments of the present invention.

Turning to FIG. 4a, a two rate data path 200 (high and low) formed using flip-flops and a control circuit 460 in accordance with other embodiments of the present invention is depicted. Two rate data path 400 includes a series of flip-flops 420 and intervening combinational logic blocks 430. Some of flip-flops 420 are configured for bypass using associated multiplexers 450, and switch on each positive going edge of a clock 472.

An input 421a of flip-flop 420a is driven by a combinational logic block 430a, and is also provided as an input to multiplexer 450a. Combinational logic block 430a receives inputs from other parts of the circuit in which two rate data path 400 is disposed. These other parts of the circuit are generically referred to as other bit slices 440a and can be any input received from a latch, flip-flop, combinational logic, I/O and/or other part of the overall circuit. An output 422a of flip-flop 420a is provided as another input to multiplexer 450a. An output 423a from multiplexer 450a is provided to combinational logic block 430b. In addition, combinational logic block 430b receives an input from other bit slices 340b. Based on the inputs, combinational logic block 430b provides an input 421b to flip-flop 420b. Thus, flip-flop 420a is electrically coupled to flip-flop 420b.

An output 422b of flip-flop 420b is electrically coupled to flip-flop 420c via combinational logic block 430c. An input 421c of flip-flop 420c is driven by combinational logic block 430c, and is also provided as an input to multiplexer 450c. An output 422c of flip-flop 420c is provided as another input to multiplexer 450c. An output 423c from multiplexer 450c is provided to combinational logic block 430d, and an output from combinational logic block 430d is provided as an input 421d to flip-flop 420b. Control circuit 460 provides a selector signal 462 to respective select inputs of multiplexers 450.

Figure 4B:
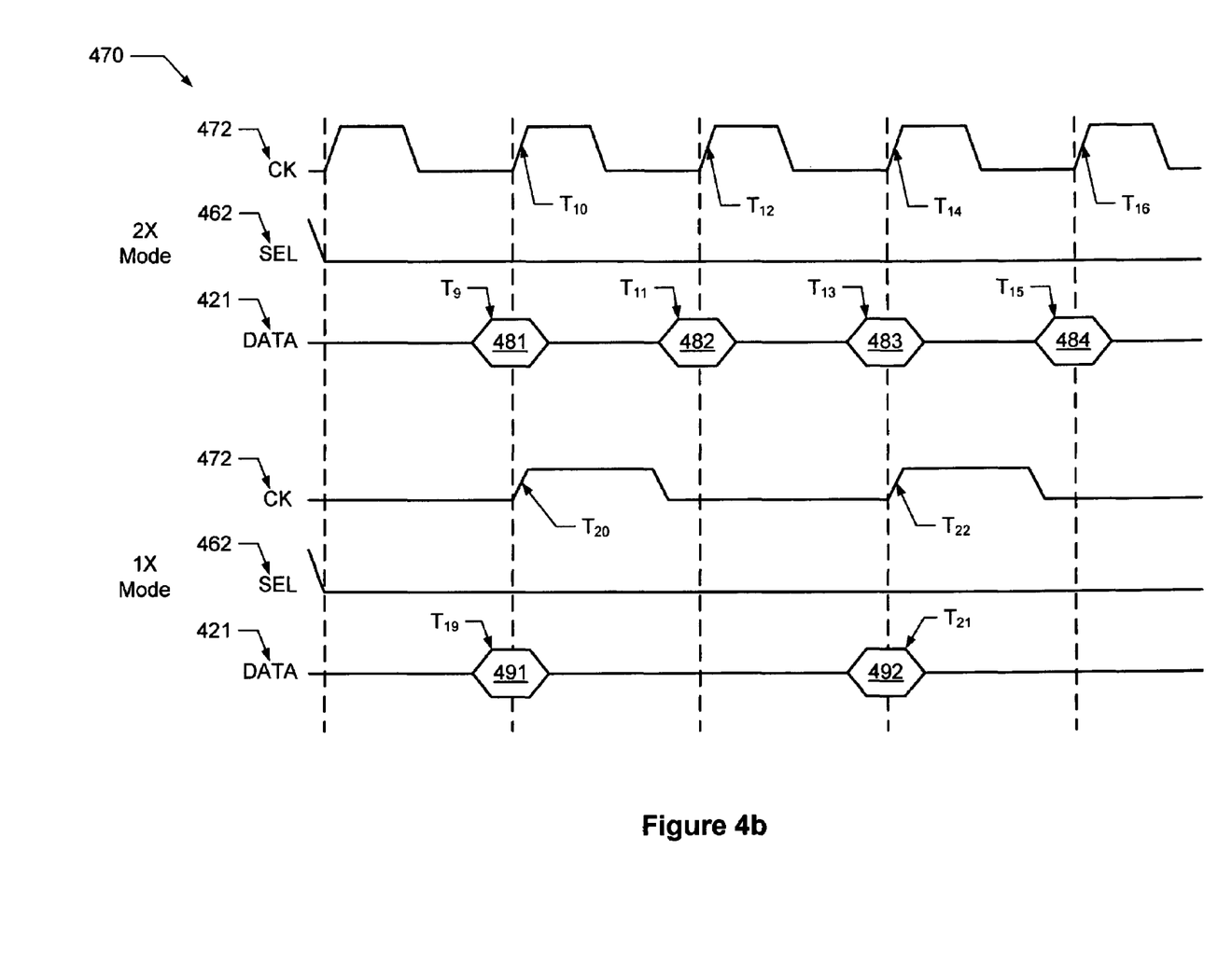

Turning to FIG. 4b, operation of two rate data path 400 is described in relation to a timing diagram 470. In particular, operation when the high rate is selected is designated as 2× mode on timing diagram 470, and the low rate of operation is designated as 1× mode on timing diagram 470. For timing diagram 470, it is assumed that flip-flops 420 operate by latching data at input 421 to output 422 on a rising edge of clock 472.

When the high rate of operation is selected, select signal 462 is asserted low such that output 422a of flip-flop 420a is provided as output 423a from multiplexer 450a, and output 422a of flip-flop 420a is provided as output 423a from multiplexer 450a. The output from combinational logic block 430a is depicted as data 421, and represented at different stage data 481, 482, 483, 484 as it moves through two rate data path 400.

In operation, the value from combinational logic 430a at input 421a stabilizes as stage data 481 at some time (T9) before the rising edge of clock signal 472 (T10), and is transferred to output 422a as clock signal 472 transitions from low to high (T10). Once transferred, the value from combinational logic 430a is maintained at data output 422a by flip-flop 420a until the next rising edge of clock signal 472 (T12). The data at output 422a propagates through multiplexer 450a and emerges as output 423a that propagates through combinational logic 430b and stabilizes as stage data 482 at input 421b sometime (T11) before the next rising edge of clock signal 472 (T12). Stage data 482 is transferred to output 422b as clock signal 472 transitions from low to high (T12), and is maintained at data output 422b by flip-flop 420b until the next rising edge of clock signal 472 (T14).

The data at output 422b propagates through combinational logic 430c and stabilizes as stage data 483 at input 421c sometime (T13) before the next rising edge of clock signal 472 (T14). Stage data 483 is transferred to output 422c as clock signal 472 transitions from low to high (T14), and is maintained at data output 422c by flip-flop 420c until the next rising edge of clock signal 472 (T16). The data at output 422c propagates through multiplexer 450c and emerges as output 423c that propagates through combinational logic 430c and stabilizes as stage data 484 at input 421c sometime (T15) before the next rising edge of clock signal 472 (T16). Stage data 484 is transferred to output 422d as clock signal 472 transitions from low to high (T16), and is maintained at data output 422d by flip-flop 420d until the next rising edge of clock signal 472 (T16).

Based on the description above, it can be appreciated that during the high rate of operation data is moved along two rate data path 200 from flip-flop to flip-flop on each rising edge of clock signal 472. The required period of clock signal 472 only needs to be sufficient to propagate through the longest of a multiplexer 450 and combinational logic block 430, or only one combinational logic block 430.

In contrast, when the low rate of operation is selected, select signal 462 is asserted high such that input 421a to flip-flop 420a is provided as output 423a from multiplexer 450a, and input 421c to flip-flop 420c is provided as output 423c from multiplexer 450c. The output from combinational logic block 430a is depicted as data 421, and represented at different stage data 491, 492 as it moves through two rate data path 400.

In operation, the value from combinational logic 430a at input 421a propagates through multiplexer 450a and combinational logic block 430b, and stabilizes as stage data 491 at some time (T19) before the rising edge of clock signal 472

(T20). Of note, the data bypasses flip-flop 420a. Stage data 491 at input 421b is transferred to output 422b as clock signal 472 transitions from low to high (T20). Once transferred, stage data 491 is maintained at data output 422b by flip-flop 420b until the next rising edge of clock signal 472 (T22). The data at output 422b propagates through combinational logic block 430c, through multiplexer 450c, through combinational logic block 430d and stabilizes as stage data 492 at some time (T21) before the rising edge of clock signal 472 (T22). Stage data 492 at input 421d is transferred to output 422d as clock signal 472 transitions from low to high (T22).

Based on the description above, it can be appreciated that during the low rate of operation, data is moved along two rate data path 400 skipping every other flip-flop 420. The required period of clock signal 472 needs to be sufficient to propagate through the longest multiplexer 450 and two combinational logic blocks 430 path. In addition to controlling the bypass of one or more flip-flops 420, some embodiments of the present invention utilize control circuit 460 to power down (i.e., remove power from) flip-flops 420 that have been bypassed. Such a power down may include removing a supply voltage from the bypassed flip-flop and tying the clock input of the flip-flop to a constant voltage level.

Figure 5:
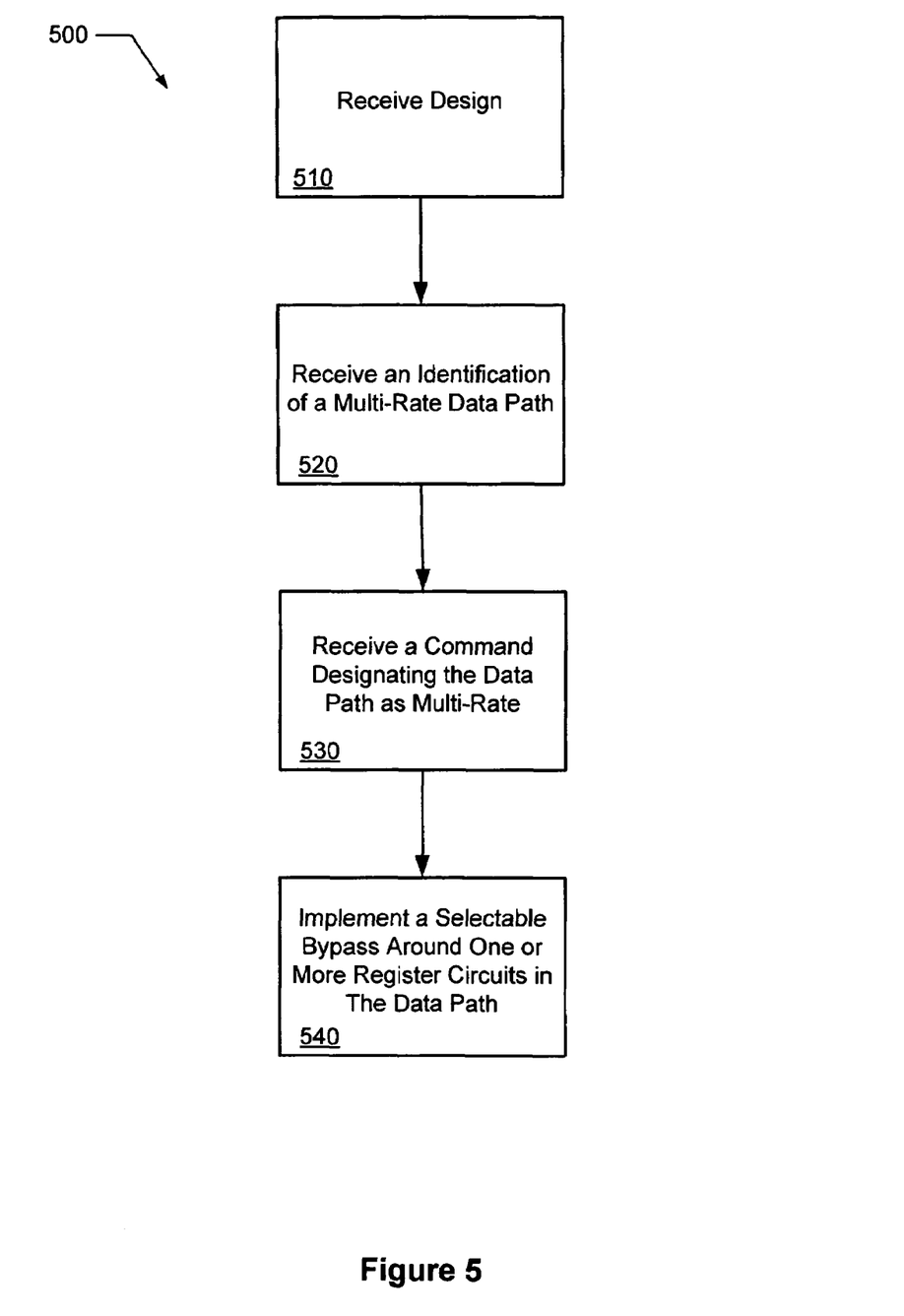
FIG. 5 is a flow diagram representing operation of a design tool capable of implementing a multi-rate data path in accordance with one or more embodiments of the present invention.

Turning to FIG. 5, a flow diagram 500 illustrates a method for an EDA software capable of forming a multi-rate data path upon receiving a design. Following flow diagram 500, a design is received (block 510). An indication of a data path in the received design is received (block 520), and a command designating the data path as multi-rate is received (block 530). The data path is originally designed for operation at the highest rate of operation, and the command indicates a lower operational rate. Selectable bypasses are implemented for one or more register circuits in the designated data path. The selectable bypasses are chosen such that the clock period associated with the lower rate of operation matches the propagation delays between non-bypassed register circuits in the data path.

In conclusion, the present invention provides novel systems, methods and arrangements for power reduction. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A semiconductor device comprising:
a multi-rate data path, wherein the multi-rate data path exhibits at least a first rate of operation and a second rate of operation, wherein the multi-rate data path includes:
a first register circuit;
a second register circuit, wherein an output of the first register circuit is electrically coupled to an input of the second register circuit via a combinational logic block, wherein the second register circuit includes a flip-flop and a multiplexer, and wherein the input to the flip-flop is electrically coupled to a first input of the multiplexer and the output of the flip-flop is electrically coupled to a second input of the multiplexer; and
a control circuit, wherein the control circuit is operable to modify a rate at which the multi-rate data path operates by selecting the first input of the multiplexer during the second rate of operation, and selecting the second input of the multiplexer during the first rate of operation.

2. The semiconductor device of claim 1, wherein a selector of the multiplexer is electrically coupled to an output of the control circuit.

3. The semiconductor device of claim 1, wherein the first register circuit includes a register device selected from a group consisting of: a latch and a flip-flop.

4. A method for variable rate data path operation, the method comprising:
providing a data path, wherein the data path exhibits a first rate of operation and a second rate of operation, wherein the first rate of operation is greater than the second rate of operation, and wherein the data path includes:
a first register circuit, wherein an input of the first register circuit is electrically coupled to a first combinational logic block; and
a second register circuit, wherein an output of the first register circuit is electrically coupled to an input of the second register circuit via a second combinational logic block; and
selecting the second rate of operation, wherein the first register circuit is bypassed, and wherein the first register circuit includes a latch with a data input, a clock input and an output; and wherein selecting the second rate of operation includes: maintaining the clock input of the latch of the first register circuit asserted during the second rate of operation, wherein a value presented at the data input is passed directly to the output.

5. A semiconductor device, the semiconductor device comprising:
a data path that exhibits at least a first rate of operation and a second rate of operation, and wherein the data path includes:
a first register circuit, wherein an input of the first register circuit is electrically coupled to a first combinational logic block;
a second register circuit, wherein an output of the first register circuit is electrically coupled to an input of the second register circuit via a second combinational logic block;
a third register circuit, wherein an output of the second register circuit is electrically coupled to an input of the third register circuit via a third combinational logic block;
a fourth register circuit, wherein an output of the third register circuit is electrically coupled to an input of the fourth register circuit via a fourth combinational logic block; and
a control circuit, wherein the control circuit is operable to modify a rate at which the data path operates by selectably bypassing at least two of the first register circuit, the second register circuit, and the third register circuit.

6. The semiconductor device of claim 5, wherein the first register circuit, the second register circuit and the third register circuit includes a register device selected from a group consisting of: a latch and a multiplexer bypassed flip-flop.

7. The semiconductor device of claim 6, wherein the multiplexer bypassed flip-flop includes a flip-flop and a multiplexer, wherein the input to the flip-flop is electrically coupled to a first input of the multiplexer and the output of the flip-flop is electrically coupled to a second input of the multiplexer, and wherein a selector of the multiplexer is electrically coupled to the control circuit.

8. The semiconductor device of claim 6, wherein the latch includes a data input, a clock input and an output; and wherein the clock input is at least in part controlled by the control circuit.

9. The semiconductor device of claim 5, wherein the first register circuit and the third register circuit are selectably bypassed during the second rate of operation; and wherein the first rate of operation is greater than the second rate of operation.

10. The semiconductor device of claim 5, wherein the data path further exhibits at least a third rate of operation; wherein the first register circuit, the second register circuit, and the third register circuit are selectably bypassed during the third rate of operation; and wherein the second rate of operation is greater than the third rate of operation.

11. A design tool, wherein the design tool comprises:
   a post-processing engine, wherein the post-processing engine is operable to:
      receive an identification of a data path, wherein the data path exhibits at least a first rate of operation and a second rate of operation, and wherein the data path includes at least a first register circuit, a second register circuit and a third register circuit;
      receive a command designating the data path to have a first rate of operation and a second rate of operation; and
      implement a control circuit, wherein the control circuit is operable to select the first rate of operation by bypassing the first register circuit and the third register circuit, and wherein the first rate of operation uses all of the first register circuit, the second register circuit and the third register circuit.

12. The design tool of claim 11, wherein the first register circuit, the second register circuit and the third register circuit are selected from a group consisting of: latches and flip-flops.

13. A semiconductor device comprising:
   a multi-rate data path, wherein the multi-rate data path exhibits at least a first rate of operation and a second rate of operation, wherein the multi-rate data path includes:
      a first register circuit;
      a second register circuit, wherein an output of the first register circuit is electrically coupled to an input of the second register circuit via a combinational logic block, wherein the second register circuit includes a latch with a data input, a clock input and an output, and wherein the clock input is at least in part controlled by a control circuit; and
   wherein the control circuit is operable to maintain the clock input of the latch of the second register circuit asserted during the second rate of operation, wherein a value presented at the data input is passed directly to the output.

14. The semiconductor device of claim 13, wherein the control circuit is further operable to toggle the clock input of the latch of the second register circuit during the first rate of operation, wherein a value presented at the data input is clocked to the output.

15. The semiconductor device of claim 13, wherein the control circuit is further operable to power down at least a portion of the latch of the second register circuit during second rate of operation.

16. The semiconductor device of claim 13, wherein the first rate of operation is greater than the second rate of operation.

17. The semiconductor device of claim 13, wherein the first register circuit includes a register device selected from a group consisting of: a latch and a flip-flop.

18. The semiconductor device of claim 1, wherein the first rate of operation is greater than the second rate of operation.

19. The semiconductor device of claim 1, wherein the control circuit is operable to power down the flip-flop of the second register circuit during the second rate operation, and to power up the flip-flop of the second register circuit during the first rate of operation.

20. The semiconductor device of claim 5, wherein the first rate of operation is greater than the second rate of operation.

* * * * *